(12) United States Patent
Prentice et al.

(10) Patent No.: US 6,538,507 B2
(45) Date of Patent: Mar. 25, 2003

(54) AUTOMATIC GAIN CONTROL CIRCUIT WITH HIGH LINEARITY AND MONOTONICALLY CORRELATED OFFSET VOLTAGE

(75) Inventors: John S. Prentice, Palm Bay, FL (US); Patrick J. Landy, Melbourne, FL (US)

(73) Assignee: Intersil Americas, Inc., Irvine, CA (US)

( * ) Notice: Subject to any disclaimer, the term of this patent is extended or adjusted under 35 U.S.C. 154(b) by 0 days.

(21) Appl. No.: 10/079,983

(22) Filed: Feb. 21, 2002

(65) Prior Publication Data
US 2002/0149423 A1 Oct. 17, 2002

Related U.S. Application Data
(60) Provisional application No. 60/272,187, filed on Feb. 28, 2001.

(51) Int. Cl.[7] ............................................... H03F 1/36
(52) U.S. Cl. ..................... 330/85; 330/134; 330/254; 330/284
(58) Field of Search ..................... 330/85, 134, 254, 330/284

(56) References Cited

U.S. PATENT DOCUMENTS

5,233,309 A * 8/1993 Spitalag et al. ............. 330/284
2002/0149423 A1 * 10/2002 Prentice ....................... 330/85

* cited by examiner

*Primary Examiner*—Michael B Shingleton
(74) *Attorney, Agent, or Firm*—Gary R. Stanford

(57) ABSTRACT

An automatic gain control (AGC) circuit including a high gain amplifier, a feedback network and two transconductance amplifiers. The feedback network has a first end that receives an input signal of the AGC circuit, a second end coupled to the output of the high gain amplifier and two intermediate nodes. Each transconductance amplifier has an input coupled to a respective intermediate node of the feedback network and an output coupled to the input of the high gain amplifier. The transconductance amplifiers collectively control a position of a virtual ground within the feedback network to control gain of the AGC circuit. The transconductance amplifiers each include an attenuator and a transconductance stage coupled between the feedback network and the high gain amplifier and are configured to operate linearly across a relatively wide input voltage range. The input offset voltage of the AGC circuit varies monotonically with gain of the AGC circuit.

30 Claims, 5 Drawing Sheets

AUTOMATIC GAIN CONTROL CIRCUIT WITH HIGH LINEARITY AND MONOTONICALLY CORRELATED OFFSET VOLTAGE

CROSS-REFERENCE TO RELATED APPLICATION(S)

The present application is based on U.S. Provisional Patent Application entitled "An Automatic Gain Control Circuit With High Linearity And Monotonically Correlated Offset Voltage", Ser. No. 60/272,187, filed Feb. 28, 2001, which is hereby incorporated by reference in its entirety. The present application is related to U.S. patent application entitled "A Variable Transconductance Amplifier", Ser. No. 09/943,668, filed Aug. 31, 2001, and is further related to U.S. patent application entitled "Precision Automatic Gain Control Circuit", Ser. No. 10/027,386, filed Dec. 21, 2001, which are both hereby incorporated by reference in their entireties.

FIELD OAF THE INVENTION

The present invention relates to an automatic gain control (ACG) circuit, and more particularly to an AGC circuit with high linearity and monotonically correlated offset voltage.

DESCRIPTION OF RELATED ART

Automatic Gain Control (AGC) circuits are used in many communication and signal processing applications. For example, in the receiver of a wired or wireless communication link, the intended signal to be processed may be a short distance away and therefore relatively strong while another signal may be a long distance away and much weaker. The receiver must process both the strong signals and the weak signals which implies a variable gain function. High gain is used to detect and amplify weak signals and low gain and/or attenuation is used to process strong signals.

In certain architectures, such as a zero intermediate frequency (ZIF) radio architecture and the like, the AGC function requires a relatively large maximum voltage gain and wide total gain range capability. Further, the gain range must be relatively matched across two baseband channels (I and Q). In order to facilitate a fast response control loop which sets the AGC, it is desired that the AGC have very good absolute gain control across process variations and temperature. The AGC should have excellent low noise and linearity performance, and work with a limited voltage supply. Additional requirements may be necessary, such as relatively high symmetry and well controlled overdrive characteristics and low overall power dissipation.

Ideal amplifiers have no input offset voltage but the inevitable mismatch between components during manufacturing results in a finite value. Input offset voltage is the apparent DC input voltage when zero input voltage is applied. That is, with zero applied input voltage, the output voltage is nonzero. The input offset voltage is equal to this output voltage divided by the amplifier voltage gain. In a ZIF radio architecture, the input offset voltage needs to be corrected before low level signals can be detected or accurately decoded. The offset correction must occur very quickly, but is complicated by the fact that the input offset voltage changes as the amplifier gain is changed. So if the input offset voltage can not be eliminated altogether, then the next best case is to have its dependency upon gain be predictable so the correction process can be as quick as possible.

The most simple gain stage that can implement an AGC function is the basic differential pair of transistors. An exemplary differential pair stage includes a pair of bipolar transistors Q1, Q2 having their emitters coupled together and to a bias current sink. A pair of load or bias resistors is each coupled between a respective collector of the differential pair and a voltage supply signal. A differential input is applied across the bases of the transistors, and a differential output is developed across the respective collectors. The gain of this stage is the transconductance of either transistor Q1 or Q2 multiplied by the load resistance. By simply varying the transconductance, the gain is changed. The transconductance can be varied by changing the bias current. A fundamental problem with this type of AGC circuit is that it has limited input signal swing capability. Input differential voltages of approximately 50 millivolts (mV) peak to peak begin to cause significant nonlinearities, which are unacceptable in many applications. Such nonlinearities, for example, may result in a total harmonic distortion (THD) that is greater than 1%. In high performance systems, AGC functions may need to handle input differential voltages as large as two (2) volts (V) peak to peak, making this AGC stage unacceptable.

The next most common gain stage used for AGC functions is the differential pair with emitter degeneration. The gain stage with emitter degeneration is similar to the simple gain stage just described and further includes a pair of emitter degeneration resistors to increase the input signal swing capability. In particular, the emitters of the differential pair of transistors Q1, Q2 are not connected to each other. Instead, each emitter is coupled to one end of a respective one of the emitter degeneration resistors. The other ends of the resistors are coupled together and to the bias current sink. The emitter degeneration resistors are ideally linear. The overall transconductance of this stage is decreased by the emitter resistors and their presence allows for more of the input signal to appear across these resistors than across the nonlinear base-emitter junctions of the transistors Q1 or Q2. This results in significantly improved linear handling of large input differential voltages. As the emitter resistors are increased, however, the overall transconductance of the stage becomes less and less dependent on the transistor's transconductance and more dependent on the emitter resistors. A fundamental problem with this arrangement is that the ability to vary the gain by changing the bias current is severely limited as the emitter resistors are increased.

More advanced AGC circuits have been suggested. One idea is to provide an analog attenuator in front of a fixed gain operational amplifier (op-amp). There are several problems with this arrangement for certain applications. First, the analog attenuator circuit requires a stack (cascode) of at least three transistors and resistors, which reduce voltage swing capability. Next, placing an attenuator in front of a large fixed gain amplifier forces the resistors that make up part of the attenuator circuitry to be very low-valued in order to meet reasonable noise performance. These low valued resistors require significant supply current.

None of the solutions described above meet all of the desired characteristics of an AGC circuit for use in a ZIF architecture.

SUMMARY OF THE PRESENT INVENTION

An automatic gain control (AGC) circuit according to an embodiment of the present invention includes a high gain amplifier, a feedback network and first and second transconductance amplifiers. The high gain amplifier has an output that asserts an output signal of the AGC circuit. The feedback network has a first end that receives an input signal of the AGC circuit, a second end coupled to the output of the high gain amplifier and first and second intermediate nodes. Each transconductance amplifier has an input coupled to a respective one of the first and second intermediate nodes of the feedback network and an output coupled to the input of the high gain amplifier. The transconductance amplifiers collectively control a position of a virtual ground within the feedback network to control gain of the AGC circuit. The transconductance amplifiers each include an attenuator coupled to the feedback network, and a transconductance stage coupled to the attenuator and to the input of the high gain amplifier.

Each transconductance amplifier is configured to operate linearly across a relatively wide input voltage range. The AGC circuit is preferably configured so that its input offset voltage varies monotonically with gain of the AGC circuit. Although it may be desired not to have any input offset voltage, a predictable offset voltage is easily compensated and reduced or eliminated.

In one embodiment, the high gain amplifier is a differential amplifier that has a differential input and a differential output with first and second polarity outputs. The feedback network includes first and second intermediate differential nodes. Each transconductance amplifier has a differential input coupled to a respective one of the first and second intermediate differential nodes of the feedback network and a differential output coupled to the differential input of the differential amplifier. The feedback network may be implemented in any of several manners. In an illustrated configuration, the feedback network includes first and second sets of resistors, where each resistor set is coupled in series between a respective polarity of the input signal and a corresponding output polarity of the differential amplifier and forms corresponding intermediate nodes. The intermediate nodes of the series-coupled resistor sets collectively form the intermediate differential nodes.

In the differential configuration, the attenuator of each transconductance amplifier is coupled to a corresponding intermediate differential node of the feedback network. Also, each transconductance stage has an input coupled to a corresponding attenuator and a differential output coupled to the differential input of the differential amplifier. In a more specific configuration, the attenuator includes first and second differential to single ended transconductance stages and a resistive device coupled between the pair of transconductance stages. Each differential to single ended transconductance stages may include a current mirror, a differential pair of transistors coupled to the current mirror, and a bias current device coupled to the differential pair of transistors. The bias current device of each transconductance stage sinks a current that is proportional to absolute temperature.

The attenuator outputs first and second intermediate differential signals, where a first polarity of the first intermediate differential signal is a first polarity of a corresponding intermediate node pair and where a first polarity of the second intermediate differential signal is a second polarity of the corresponding intermediate node pair. Each transconductance stage of the transconductance amplifiers includes first and second pairs of differential transistors and at least one bias current device. The first pair of differential transistors receive the first intermediate differential signal and provides a first polarity of a differential output signal. The second pair of differential transistors receives the second intermediate differential signal and provides a second polarity of the differential output signal. The one or more bias current devices bias the first and second pairs of differential transistors. In a specific embodiment illustrated, the attenuator and transconductance stage of each transconductance amplifier are each implemented using bipolar junction transistors. It is understood, however, that different types of transistors and/or circuit components may be employed to achieve similar functionality, so that the present invention is not limited to any particular circuit implementation.

In one embodiment, a first bias current device is coupled to bias the transconductance stage of the first transconductance amplifier and a second bias current device is coupled to bias the transconductance stage of the second transconductance amplifier. Further, the first and second bias current devices may be controllable current sources that are controlled to modify gain of the AGC circuit. For enhanced linearity, a current sum of the controllable current sources remains constant across a gain range. The controllable current sources may be controlled by a single differential current signal, and may be electronically controllable. The bias current control devices may be variable between a predetermined maximum current level and a predetermined minimum current level to control gain. Thus, one bias current control device is linearly increased while the other is linearly decreased so that the total bias current remains substantially constant.

It is appreciated that a gain circuit as described herein has a gain that is varied as the virtual ground is varied. The gain is determined by a resistor and/or transconductance ratio, which can change linearly, exponentially (e.g., linear in dB), or according to any other useful function. The maximum undistorted signal level may be scaled by resistors and does not require more than two input stages. Linearity may be adjusted independently of the feedback resistive network. A gain control network is provided which is within and part of the closed loop amplifier gain circuit. The gain circuit may be DC or AC coupled, and may be cascaded with other similar gain circuits. A differential gain circuit is disclosed that does not require a common mode reference. The gain circuit has a low absolute gain tolerance and excellent gain matching across different gain circuits on the same silicon die of an IC. A control circuit is described that allows optimization of both noise and linearity performance in the gain circuit. This capability is allowed for by individually sequencing transconductance cells that make up the gain circuit so that only two are active at any given time. The control circuit may implement a ramp function which has precise current ratio capability and precise turn-on and turn-off set points. The control circuit may also be cascaded if desired. Although the input offset error voltage is not eliminated, it nonetheless changes monotonically with gain making offset voltage correction predictable for easy compensation.

BRIEF DESCRIPTION OF THE DRAWINGS

A better understanding of the present invention can be obtained when the following detailed description of embodiments of the invention is considered in conjunction with the following drawings, in which.

DETAILED DESCRIPTION OF EMBODIMENT(S) OF THE INVENTION

Figure 1:
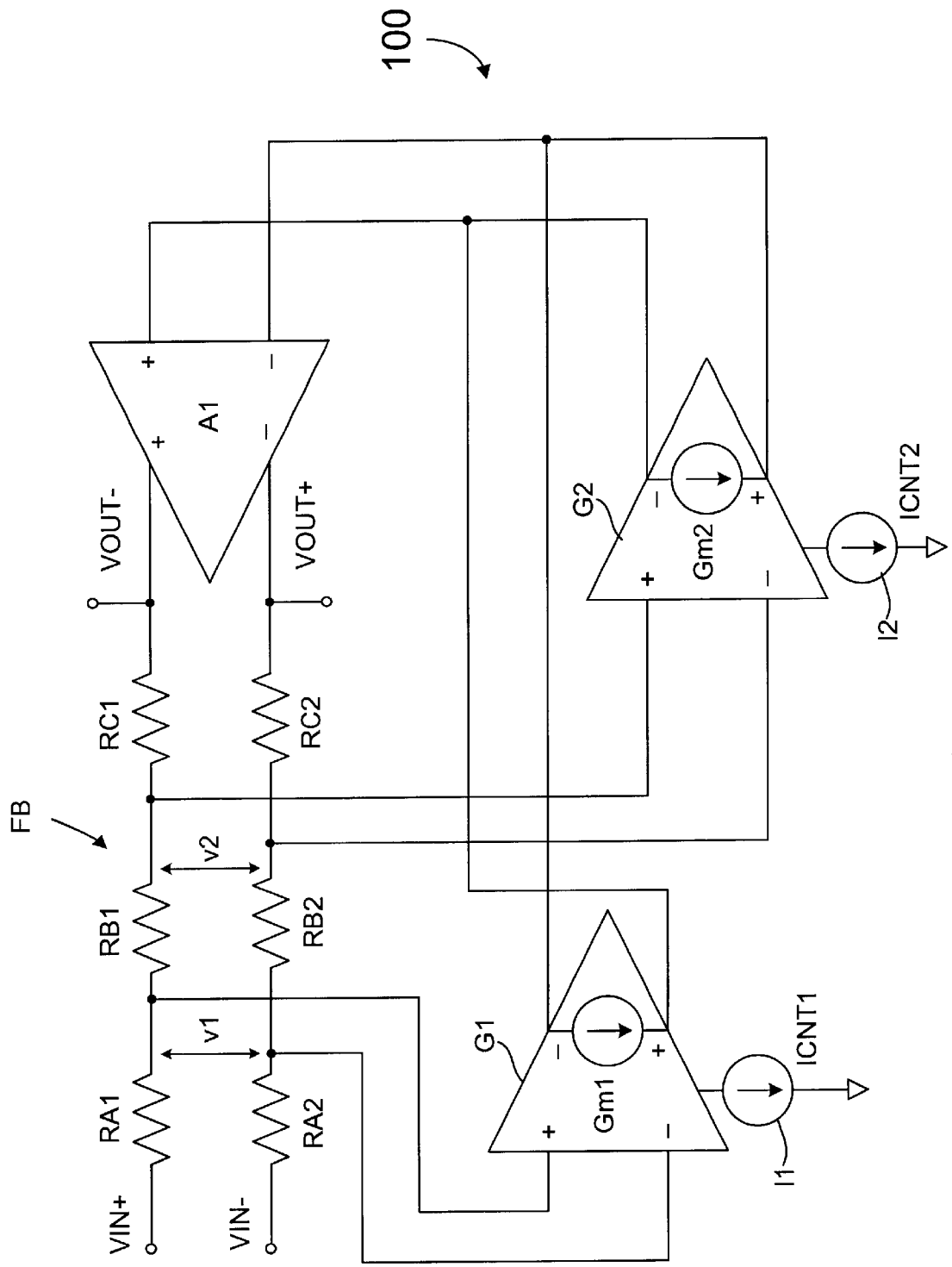
FIG. 1 is a schematic diagram of an exemplary AGC circuit according to an embodiment of the present invention which exhibits high linearity and monotonically correlated offset voltage.

FIG. 1 is a schematic diagram of an exemplary AGC circuit 100 according to an embodiment of the present invention which exhibits high linearity and monotonically correlated offset voltage. The AGC circuit 100 includes six feedback resistors RA1, RA2, RB1, RB2, RC1 and RC2, a pair of transconductance amplifiers G1 and G2, a pair of control current sources I1 and I2, and a high gain transimpedance stage amplifier A1. The transconductance amplifiers G1 and G2 have transconductances Gm1 and Gm2, respectively. The control current sources I1 and I2 sink control currents ICNT1 and ICNT2, respectively. The AGC circuit 100 receives a differential input voltage VIN with positive and negative polarity signals VIN+ and VIN−, where VIN=(VIN+)−(VIN−). The AGC amplifier 201 provides a differential output voltage VOUT with positive and negative polarity signals VOUT+ and VOUT−, where VOUT=(VOUT+)−(VOUT−).

The input signals VIN+, VIN− are provided to respective ends of the two resistors RA1 and RA2. The other end of the resistor RA1 is coupled to one end of the resistor RB1 forming a first intermediate node, which is further coupled to the non-inverting input of the transconductance amplifier G1. The other end of the resistor RB1 is coupled to one end of the resistor RC1 forming a second intermediate node, which is further coupled to the non-inverting input of the transconductance amplifier G2. The other end of the resistor RC1 is coupled to the non-inverting output of the amplifier A1, which generates the negative polarity signal VOUT−. The other end of the resistor RA2 is coupled to one end of the resistor RB2 forming a third intermediate node, which is further coupled to the inverting input of the transconductance amplifier G1. The other end of the resistor RB2 coupled to one end of the resistor RC2 forming a fourth intermediate node, which is further coupled to the inverting input of the transconductance amplifier G2. The other end of the resistor RC2 is coupled to the inverting output of the amplifier A1, which generates the positive polarity output signal VOUT+.

The inverting outputs of the transconductance amplifiers G1 and G2 are coupled together and to the non-inverting input of the amplifier A1. The non-inverting outputs of the transconductance amplifiers G1 and G2 are coupled together and to the inverting input of the amplifier A1. The transconductance amplifier G1 is coupled to the current source I1 and biased with the control current ICNT1. The transconductance amplifier G2 is coupled to the current source I2 and biased with the control current ICNT2. A differential voltage node v1 is defined between the first and third intermediate nodes and a differential voltage node v2 is defined between the second and fourth intermediate nodes.

In this manner, the AGC circuit 100 has four component parts, including the pair of transconductance amplifiers G1 and G2, the amplifier A1, a feedback network FB including the resistors RA1–RC2 and a pair of control currents formed by the current sources I1 and I2. The differential outputs of the transconductance amplifiers G1 and G2 drive the differential inputs of the amplifier A1. The differential outputs of the amplifier A1 drive the feedback network FB receiving the differential input VIN and coupled to the inputs of the transconductance amplifiers G1 and G2. The AGC circuit 100 uses only two transconductance stages which are designed to remain linear in the presence of relatively large input voltages.

In operation, when the current source I1 is turned on while the current source I2 is turned off, and a positive input signal (VIN+>VIN−) is applied, the first transconductance amplifier G1 outputs a negative current in response. The second transconductance amplifier G2 is off and inactive or otherwise presents a high impedance that does not practically influence the operation. This negative input current from the first transconductance amplifier G1 is applied to the high gain transimpedance amplifier A1, which causes it to output a voltage. The reverse polarity or negative output of the amplifier A1 is connected through the feedback network FB to the input. It is noted that a polarity change occurs between the inputs and outputs of the transconductance amplifiers G1 and G2. The transimpedance amplifier A1 does not invert the signal.

In general, the gain of a feedback amplifier, such as the AGC circuit 100, may be defined in terms of the feedback resistors of the feedback network FB and a virtual ground. If a large number of very small value resistors are series connected with one end of the resistor string connected to a positive voltage and the other end connected to a negative voltage, there exists a node within the resistor string that has a voltage approximately zero. This zero voltage node is considered a "virtual ground" since it has the same potential as ground but is not connected directly to ground. If this resistor string is the feedback network for a feedback amplifier, it can be shown that the closed loop voltage gain is equal to the ratio of the total resistance between the virtual ground node and the output divided by the total resistance between the virtual ground node and the input.

In reference to the AGC circuit 100, with the transconductance amplifier G1 on and transconductance amplifier G2 off, the differential virtual ground is at the node v1. Likewise, with the transconductance amplifier G1 off and the transconductance amplifier G2 off, the differential virtual ground is at the node v2. The resistors RB1 and RB2 may be thought of as an infinite number of series-connected, infinitely small value resistors, so that with both of the transconductance amplifiers G1 and G2 on, there exists a differential virtual ground between two nodes inside RB1 and RB2. The gain is then the sum of the resistors RC (RC1 and RC2) plus a fraction of resistors RB (RB1 and RB2) divided by the sum of resistors RA (RA1 and RA2) and the remainder of the resistor RB. In effect, it is as though the location of the virtual ground is forced to move from one end of each of the resistors RB1 and RB2 to the other ends as gain goes from minimum to maximum.

Assume RA=RA1=RA2, RB=RB1=RB2, and RC=RC1=RC2. When the current source I1 is on and the current source I2 off, the virtual ground is at node v1 and the overall gain is at a maximum and simplifies to (RB+RC)/RA. When the current source I1 is on and the current source I2 off, the virtual ground moves to node v2 and the overall gain is at a minimum and simplifies to RC/(RA+RB). It is noted that for these maximum and minimum gain cases, the gain is a ratio of the resistors RA–RC, which can be very precisely matched (e.g. 0.2%) in integrated circuit (IC) processing. Therefore, the overall gain may be precisely controlled for these cases.

The final case is when both of the current sources I1 and I2 are on. For this case, the virtual ground is virtually positioned between nodes v1 and v2, where the gain is between the maximum and minimum cases. The gain involves a resistive ratio as well as a transconductance ratio. Transconductance ratios can also be precisely matched (e.g. <1%) in IC processing. Therefore, the gain is precisely controlled throughout the entire gain range. In summary, the AGC circuit 100 is in a negative feedback configuration in which its gain is varied by the control currents to the transconductance amplifiers G1 and G2.

Assuming that the input currents to the transconductance amplifiers G1 and G2 are negligible, the voltages at the v1 and v2 nodes are provided by the following equations 1 and 2, respectively:

$$v1=VIN[(RB+RC)/(RA+RB+RC)]+VOUT[(RA)/(RA+RB+RC)] \quad (EQ\ 1)$$

$$v2=VIN[(RC)/(RA+RB+RC)]+VOUT[(RA+RB)/(RA+RB+RC)] \quad (EQ\ 2)$$

where $RA=RA1=RA2$, $RB=RB1=RB2$, and $RC=RC1=RC2$.

The output voltage of the AGC circuit 100 is a function of the v1 and v2 voltages as illustrated by the following equation 3:

$$VOUT=-RT[(v1)(Gm1)+(v2)(Gm2)] \quad (EQ\ 3)$$

where RT is the trans-resistance of the amplifier A1. The following equation 4 results by substituting equations 1 and 2 into the equation 3 to solve for the output voltage VOUT:

$$VOUT \sim -VIN[(Gm1)(RB+RC)+(Gm2)(RC)]/[(Gm1)(RA)+(Gm2)(RA+RB)] \quad (EQ\ 4)$$

for $RT(Gm1+Gm2)>>1$ and where "∼" denotes "approximately equal".

Figure 2:
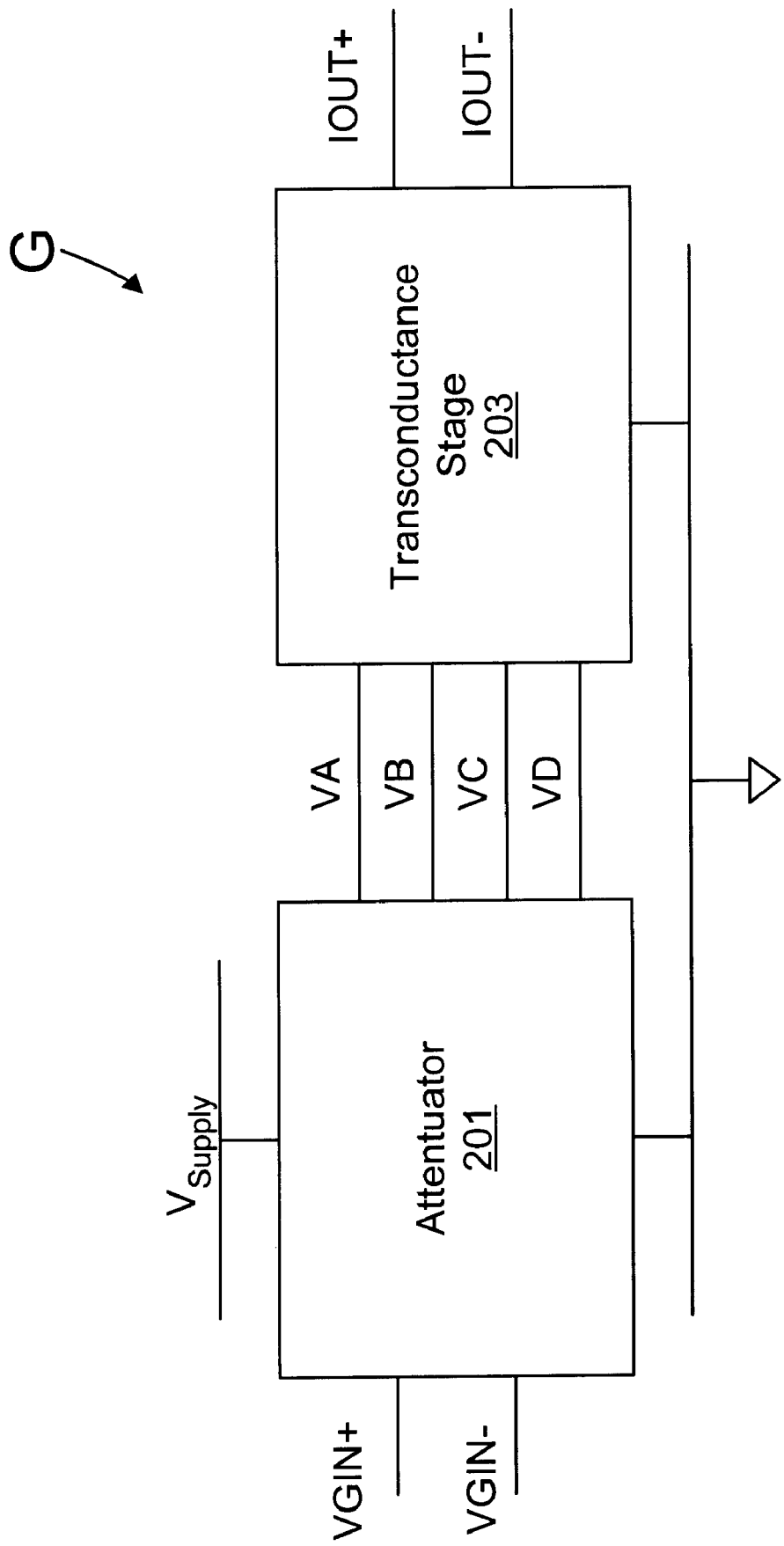
FIG. 2 is a block diagram of an exemplary transconductance amplifier including an attenuator coupled to a transconductance stage, where the exemplary transconductance amplifier may be used as either or both of the transconductance amplifiers of the AGC circuit of FIG. 1.

FIG. 2 is a block diagram of an exemplary transconductance amplifier G that may be employed as either or both of the transconductance amplifiers G1 and G2 and further incorporates control current sources I1 and I2. The transconductance amplifier G includes a first stage attenuator 201 that reduces the voltage applied to a second transconductance stage 203. Electronic gain control is applied to either or both the attenuator 201 and the transconductance stage 203. The attenuation may be increased in the presence of increasing input voltage to maintain linearity. In the embodiment shown, the attenuator 201 is fixed and set to a predetermined value to establish linearity. The attenuator 201 is referenced between a voltage supply signal $V_{Supply}$ and ground and receives a differential input voltage VGIN having differential polarity signals VGIN+ and VGIN-, where VGIN=VGIN+-VGIN-. The attenuator 201 asserts four voltage signals VA, VB, VC and VD (having voltages of VA, VB, VC and VD, respectively) to the transconductance stage 203, which generates a differential output current IOUT having differential polarity output current signals IOUT+ and IOUT-, where IOUT=IOUT+-IOUT-.

Figure 3:
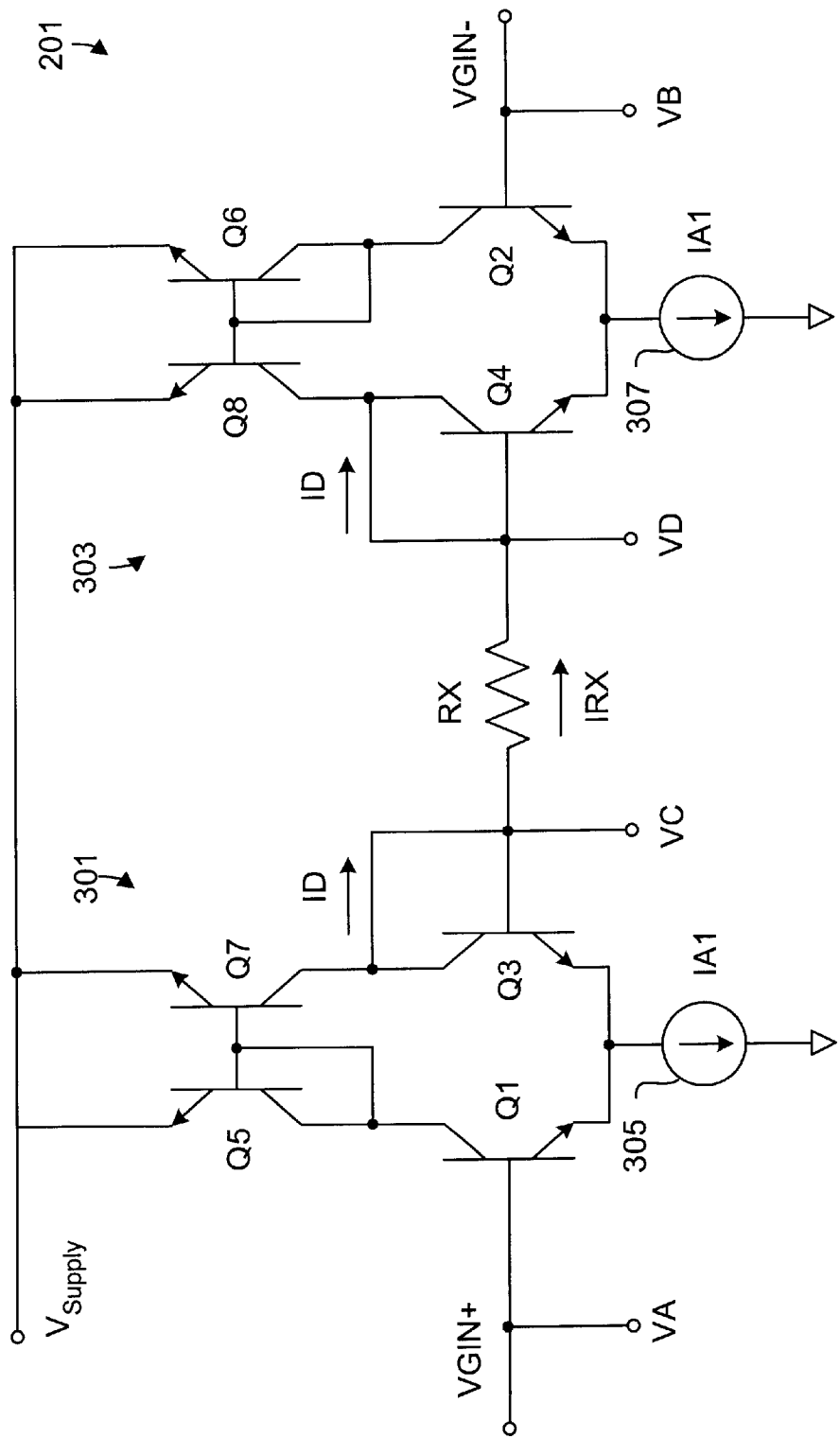
FIG. 3 is a schematic diagram of an exemplary embodiment of the attenuator of FIG. 2.

FIG. 3 is a schematic diagram of an exemplary embodiment of the attenuator 201. The attenuator 201 includes NPN bipolar junction transistors (BJTs) Q1-Q4, PNP BJTs Q5-Q8, a resistor RX and two constant current supplies or sinks 305, 307. The resistor RX is replaced with a resistor R1 for the transconductance amplifier G1 and is replaced with a resistor R2 for the transconductance amplifier G2. The current sink 305 draws a current IA1 and the current sink 307 draws a current LA2. The emitters of the transistors Q5-Q8 are coupled to the $V_{Supply}$ signal. The bases of the transistors Q5 and Q7 are coupled together and the base of the transistor Q5 is coupled to its collector. In a similar manner, the bases of the transistors Q6 and Q8 are coupled together and the base of the transistor Q6 is coupled to its collector.

The collectors of the transistors Q5, Q7, Q8 and Q6 are coupled to the collectors of the transistors Q1, Q3, Q4 and Q2, respectively. The emitters of the transistors Q1 and Q3 are coupled together and to one end of the current sink 305, having its other end coupled to ground. The emitters of the transistors Q2 and Q4 are coupled together and to one end of the current sink 307, having its other end coupled to ground. The bases of the transistors Q1 and Q2 receive the VGIN+ and VGIN- signals, respectively, which are the same as the VA and VB signals, respectively. The bases of the transistors Q3 and Q4 develop the VC and VD signals, respectively. The resistor RX has one end coupled to the base of the transistor Q3 and its other end coupled to the base of the transistor Q4. A current ID is defined as flowing from the collector to the base of the transistor Q3 and is the same current flowing from the base to the collector of the transistor Q4. A current IRX is defined as flowing through the resistor RX between the VC and VD signals. The IRX current is replaced with a current IR1 for the resistor R1 and a current IR2 for the resistor R2.

The four output voltages VA-VD are a function of the differential input voltage VGIN with the VA and VB signals being the same as the two VGIN+ and VGIN- input signals. There are two differential pairs of transistors, Q1, Q3 and Q2, Q4, connected to each end of the resistor RX. In the embodiment shown, the transistors Q1-Q4 are substantially identical. The transistors Q3 and Q4 are diode connected, having their bases and collectors shorted together. The transistors Q5 and Q7 are configured as a first current mirror 301 and the transistors Q6 and Q8 are configured as a second current mirror 303. In this manner, the collectors of the transistors Q1 and Q2 are connected to the inputs of the current mirrors 301 and 303 with the current mirror outputs connected to the collectors of the transistors Q3 and Q4. The current mirrors 301 and 303 are shown as PNP transistors but may be implemented with any other current mirror configuration. For example, the current mirrors 301 and 303 may be implemented using other types of transistors, such as PMOS transistors or the like. Also, in the embodiment shown the current mirrors 301 and 303 have an output/input ratio of 1:1, the current sources 305 and 307 are assumed to be matched, and the base currents are assumed to be negligible.

The combination of a differential pair of transistors Q1 and Q3 with the first current mirror 301 forms a differential-to single-ended transconductance stage with an output current (ID) equal to the differential current out of the differential pair. This current also flows through the resistor RX (IRX), and is defined according to the following equation 5:

$$ID=IRX=(IA)\tan h[(VA-VC)/2VT]=(IA)\tan h[(VD-VB)/2VT] \quad (EQ\ 5)$$

where $IA2=IA1=IA$ and where VT is a thermal coefficient voltage (the voltage equivalent of temperature, where $VT=kT/q$, where "k" is the Boltzmann constant in joules per degree Kelvin, T is the temperature in degrees Kelvin (absolute scale), and "q" is the magnitude of the charge of an electron). The differential input voltage is equal to the current-resistive (IR) drop across the resistor RX plus the two differential input voltages of the two differential pairs as illustrated in the following equations 6 and 7:

$$VGIN+-VGIN-=(VA-VC)+(ID)RX+(VD-VB)= 2(VA-VC)+(IA)(RX)\tan h[(VA-VC)/2VT] \quad (EQ\ 6)$$

$$VIN+-VIN-\sim 2(VA-VC)+[(IA)(RX)/2VT](VA-VC)= (VA-VC)(2+[(IA)(RX)/2VT]) \quad (EQ\ 7)$$

where $|(VA-VC)|<VT$. The following equation 8 is the attenuator transfer function showing that the voltage applied to either differential pair is a fraction less than or equal to one-half of the input voltage:

$$(VA-VC) \sim (VGIN+ -VGIN-)(2VT/[4VT+(IA)(RX)]) \quad (EQ\ 8)$$

where, again, $|(VA-VC)| < VT$. This fraction becomes smaller as the bias current IA gets larger. This fraction is independent of temperature when IA is made proportional to absolute temperature (PTAT). The following equation 9 shows the conditions for linear operation:

$$|(VA-VC)| < VT \rightarrow |(VGIN+ -VGIN-)| < (2VT+(IA)(RX)/2) \quad (EQ\ 9)$$

The maximum input voltage can increase if the current IA increases, but increasing IA and/or RX also increases the amount of attenuation.

Figure 4:
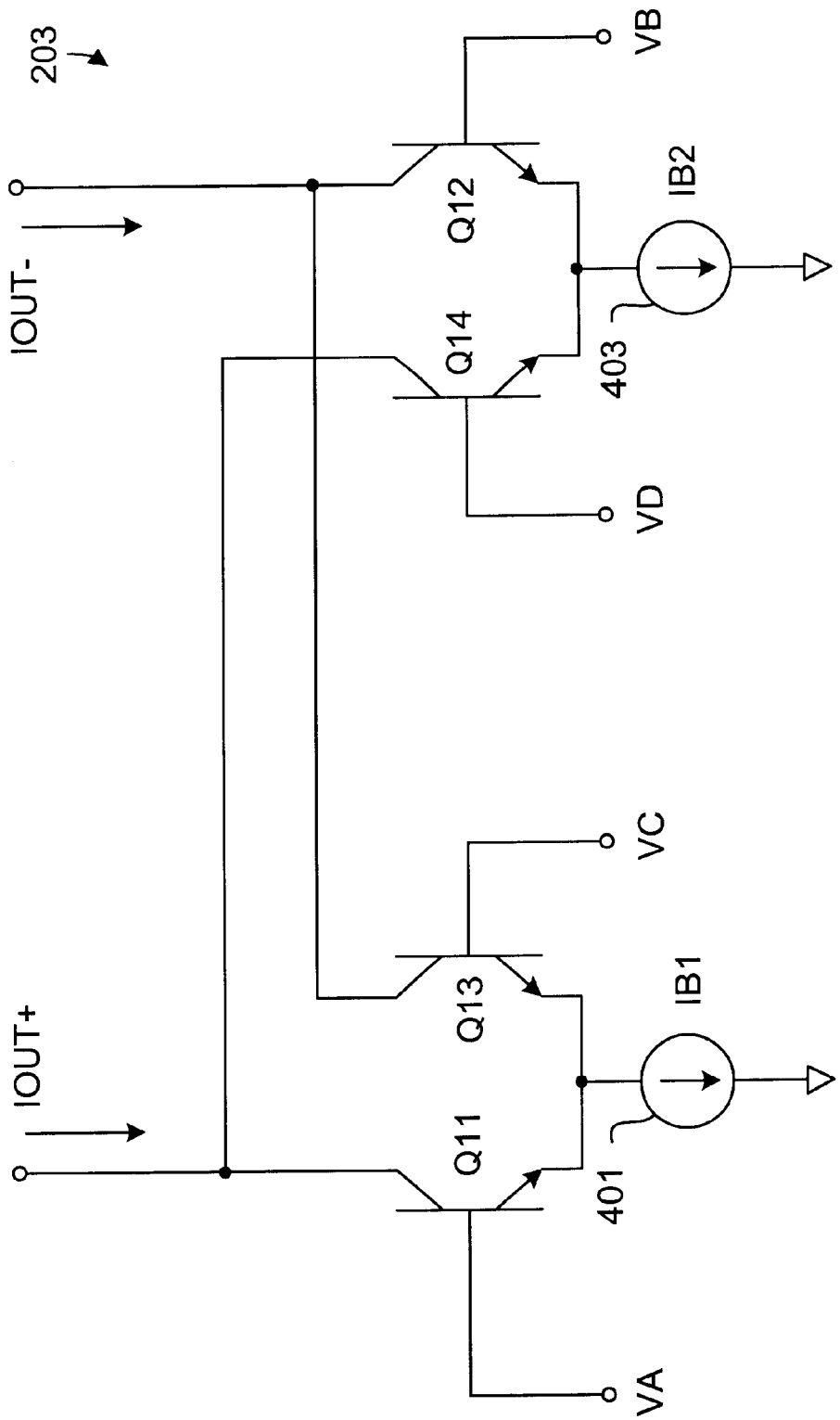
FIG. 4 is a schematic diagram of an exemplary embodiment of the transconductance stage of FIG. 2.

FIG. 4 is a schematic diagram of an exemplary embodiment of the transconductance stage 203. The transconductance stage 203 includes four NPN BJTs Q11, Q12, Q13 and Q14 and two current sinks 401 and 403. The transistors Q11 and Q13 are coupled together at their emitters and to one end of the current sink 401 that sinks a current of IB1. The transistors Q12 and Q14 are coupled together at their emitters and to one end of the current sink 403 that sinks a current of IB2. The VA–VD signals are provided to the bases of the transistors Q11–Q14, respectively. The collectors of the transistors Q11 and Q14 are coupled together and develop the IOUT+ output signal. The collectors of the transistors Q12 and Q13 are coupled together and develop the IOUT– output signal. Since the four outputs from the attenuator 201 are the four input signals to the transconductance stage (VA, VB, VC and VD), the following equation 10 describes the differential output current IOUT:

$$(IOUT+ -IOUT-) = (IB1)\tan h[(VA-VC)/2VT] + (IB2)\tan h[(VD-VB)/2VT] = 2(IB)\tan h[(VA-VC)/2VT] \quad (EQ\ 10)$$

where IB2=IB1=IB. Substituting the attenuator transfer function (EQ 8) into the transconductance function above, yields the following equation 11:

$$(IOUT+ -IOUT-) \sim (VGIN+ -VGIN-)(2(IB)/[4VT+(IA)(RX)]) \quad (EQ\ 11)$$

where $|(VA-VC)| < VT$. The transconductance "Gm" of the transconductance amplifier G employing the attenuator 201 and the transconductance stage 203 is defined according to the following equation 12:

$$Gm = (IOUT+ -IOUT-)/(VIN+ -VIN-) \sim 2(IB)/[4VT+(IA)(RX)] \quad (EQ\ 12)$$

The differential output current is proportional to the current IRX flowing through the resistor RX. The transconductance can be varied by changing either the bias current to the transconductance stage (IB) or the bias current to the attenuator stage (IA) or by varying both.

The transconductance amplifiers G1 and G2 do not need to be identical. Variation between the transconductance amplifiers G1 and G2 can be used to adjust the AGC amplifier transfer function, i.e., the gain versus control voltage. Using the equation 12 above, the transconductances Gm1 and Gm2 of the transconductance amplifiers G1 and G2, respectively, are provided by the following equations 13 and 14:

$$Gm1 = 2(ICNT1)/[4VT+(IA)(R1)] \quad (EQ\ 13)$$

$$Gm2 = 2(ICNT2)/[4VT+(IA)(R2)] \quad (EQ\ 14)$$

where IB is substituted with ICNT1 and ICNT2, respectively, and where RX is substituted with the resistors R1 and R2, respectively. Substituting the transconductances Gm1 and Gm2 from the equations 13 and 14 into the feedback amplifier gain provided by equation 4 gives the voltage gain as a function of the control currents ICNT1 and ICNT2 as provided by the following equation 15:

$$\frac{VOUT}{VIN} \sim -\frac{\{2(ICNT1)/[4VT+(IA)(R1)]\}(RB+RC) + \{2(ICNT2)/[4VT+(IA)(R2)]\}(RC)}{\{2(ICNT1)/[4VT+(IA)(R1)]\}(RA) + \{2(ICNT2)/[4VT+(IA)(R2)]\}(RA+RB)} \quad (EQ\ 15)$$

Assuming that the attenuator bias currents IA is PTAT according to the following equation 16:

$$IA = 4VT/Rbias \quad (EQ\ 16)$$

for a temperature independent bias resistor Rbias, then the amplifier gain relationship simplifies to the following equation 17:

$$\frac{VOUT}{VIN} \sim -\frac{[2(ICNT1)/(Rbias+R1)](RB+RC) + \{2(ICNT2)/(Rbias+R2)](RC)}{[2(ICNT1)/[Rbias+R1)](RA) + [2(ICNT2)/(Rbias+R2)](RA+RB)} \quad (EQ\ 17)$$

It is noted that IA is set for optimal operation for the particular configuration. Rbias is then derived based on the relationship provided in equation 16.

Figure 5:
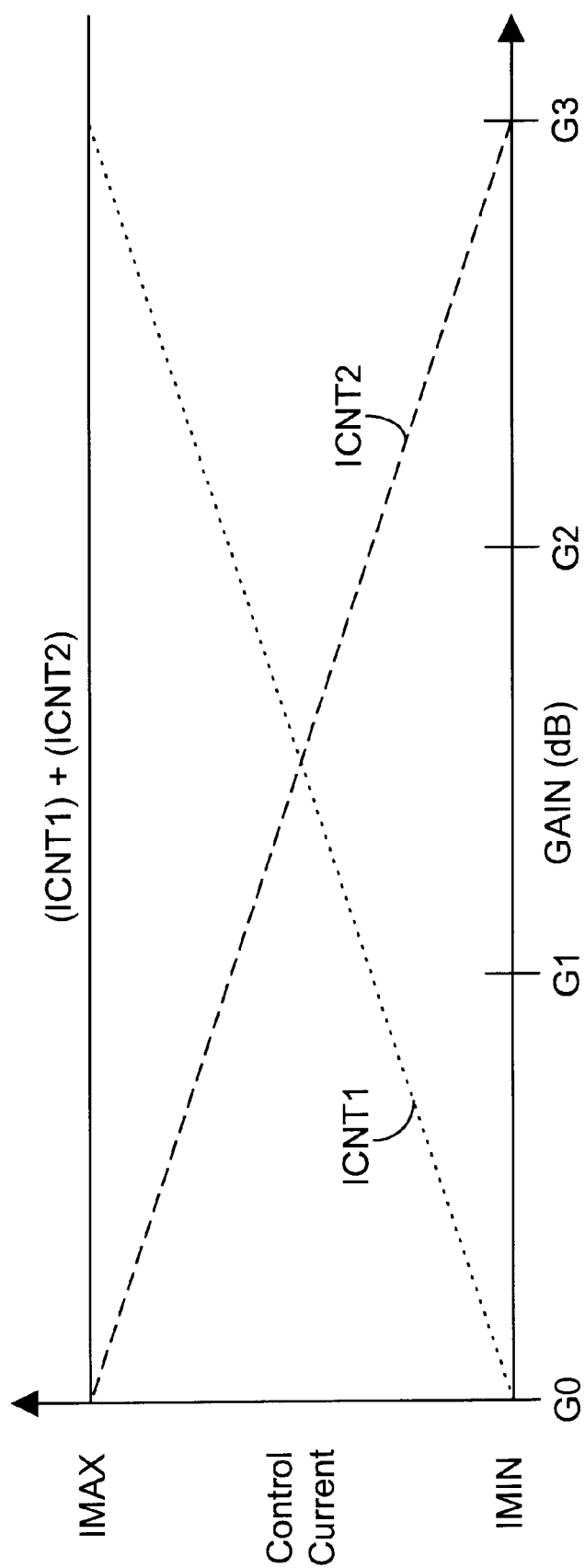
FIG. 5 is graph diagram of the control currents versus gain in decibels (dB) for a particular configuration of the AGC circuit of FIG. 1.

In one embodiment, single-ended signals are contemplated, and simple mirrors may be used to generate the control currents ICNT1 and ICNT2. In another embodiment, a single differential input current is applied as the control currents ICNT1 and ICNT2. For example, the differential input currents may be the outputs of a digital to analog converter (DAC) and are optionally differential to improve isolation. FIG. 5 is graph diagram of the control currents ICNT1 and ICNT2 versus gain in decibels (dB) for a particular configuration of the AGC circuit 100. The gain varies from a minimum G0 to a maximum G3 and each control current varies from a predetermined minimum IMIN to a predetermined maximum IMAX. When ICNT1 is IMAX, ICNT2 is at IMIN and the gain is maximum at G3. When ICNT2 is at IMAX, ICNT1 is at IMIN and the gain is minimum at G0. The sum of the two control currents is constant (IMAX) over the entire operating range. In one embodiment, IMIN is approximately zero.

If "x" is defined as the ratio of ICNT1 to the total current, such as IMAX, then the gain may be expressed according to the following equation 18:

$$\frac{VOUT}{VIN} \sim -\frac{[(x)/(Rbias+R1)](RB+RC) + [(1-x)/(Rbias+R2)](RC)}{[(x)/(Rbias+R1)](RA) + [(1-x)/(Rbias+R2)](RA+RB)} \quad (EQ\ 18)$$

for x=ICNT1/(ICNT1+ICNT2) and ranging between 0 and 1, inclusive. The transconductance stage resistors R1 and R2 can be used to adjust the gain at the midpoint of the control curve, which facilitates making the gain transfer function linear in dB as illustrated by the following equations 19 and 20:

$$\frac{VOUT}{VIN} \sim -\frac{(RB+RC)/(Rbias+R1)+}{(RA)/(Rbias+R1)+} \quad \text{(EQ 19)}$$
$$\frac{(RC)/(Rbias+R2)}{(RA+RB)/(Rbias+R2)}$$

for x=0.5, and $$\frac{VOUT}{VIN} \sim -\frac{(x)(RB+RC)/(R1')+}{(x)(RA)/(R1')+} \quad \text{(EQ 20)}$$
$$\frac{(1-x)(RC)/(R2')}{(1-x)(RA+RB)/(R2')}$$

for R1'=Rbias+R1 and R2'=Rbias+R2.

It is assumed that there is an input offset voltage associated with each transconductance amplifier G1 and G2. These input offset voltages, referred to as vio1 and vio2, respectively, may be represented as voltage sources in series with each input of the transconductance amplifiers G1 and G2. If vio1 and vio2 are added to the v1 and v2 voltages according the equations 1 and 2, respectively, and then the above analysis is repeated, an expression for the AGC circuit 100 output voltage as a function of the input voltage and both transconductance stage offset voltages is achieved. The AGC input offset voltage "vio" is defined as the value of input voltage required to make the output voltage equal to zero as illustrated by the following equation 21:

$$vio = -\frac{(vio1)(x)(RA+RB+RC)/(R1')+}{(x)(RA)/(R1')+(1-x)(RA+RB)/(R2')} \quad \text{(EQ 21)}$$

If the second derivative of the AGC amplifier offset voltage with respect to x is zero for any value of x (x goes from zero to one), then the offset voltage could be non-monotonic. The input offset voltages for these type of transconductance stages are practically independent of the control currents ICNT1 and ICNT2. The second derivative of vio is provided by the following equation 22:

$$d^2vio/dx^2 = -2[(RA/R1')-(RA+RB)/R2'](Y) \quad \text{(EQ 22)}$$

where "Y" is defined according to the following equation 23:

$$Y = \frac{(vio1)(RA+RB)(RA+RB+RC)/(R1')(R2')+}{([(x)(RA)/(R1')+(1-x)(RA+RB)/(R2')])^3} \quad \text{(EQ 23)}$$

where the only way that the second derivative is zero is if the expression [(RA/R1')−(RA+RB)/R2'] from equation 21 is zero. However, this is the special case where the offset voltage changes linearly with x which, of course, is also monotonic. Therefore, the offset voltage does change monotonically with the gain thus permitting the use of fast, predictive offset correction algorithms.

Since the dominant sources of input offset voltage occur within the input stage, AGC amplifiers with more than two input stages have input offset voltages that can change erratically as the gain is changed. The embodiment shown of the AGC circuit 100 with only two transconductance amplifier stages simplifies the control circuit and has the desired characteristic in that input offset voltage changes monotonically with gain. This means that after the offset voltages are found at minimum and maximum gain settings, the offset voltage at any other gain setting of the AGC circuit 100 may be accurately predicted. Accurate offset prediction reduces or otherwise eliminates the need to initiate a time consuming search algorithm each time the gain is changed. In one embodiment, the control circuit is linear in dB. The transconductance amplifiers G1 and G2 operate linearly with relatively large input voltage signals and may be implemented to be electronically controllable. For example, the control current sources I1 and I2 implemented using current sinks 401 and 403 or the like are easily implemented using electronically controllable bias current control devices. It is noted that the present invention is not limited to any particular number of input stages.

An AGC circuit according to the present invention has many desirable characteristics. The gain is varied as a virtual ground is varied. Resistor and/or transistor transconductance (gm) ratios determine the gain. The maximum undistorted signal level may be scaled by resistors and does not necessarily require more than two input stages. Linearity can be adjusted independently of the feedback network FB. While not eliminated, the input offset error voltage does change monotonically with gain making offset voltage correction predictable. The gain may change exponentially, so that it may be linear in dB. In one embodiment, the gain control network may be within and part of a closed loop amplifier gain circuit. The AGC circuit may be DC or AC coupled and may be cascaded. The AGC circuit is a differential gain circuit which requires no common mode reference. The AGC circuit has low absolute gain tolerance and excellent gain matching across different gain circuits on the same silicon die. The AGC circuit does not require a sophisticated gain control circuit, and the control circuit maybe cascaded if desired.

A ZIF architecture requires an AGC function which has a relatively large maximum voltage gain (such as 1000 Volts/Volt (V/V) in an exemplary embodiment) and a relatively large total gain range capability (such as 66 db in the exemplary embodiment). Further, the gain range should match across the two baseband channels (I and Q) precisely, such as within 0.1 db of each other. In order to facilitate a fast response digital control loop which sets the AGC, it is desired that the AGC have absolute gain control to +/−1 db across process variations and temperature. The AGC is DC coupled, should have low noise and high linearity performance, and work with a limited voltage supply (such as 2.7 V in the exemplary embodiment). Additional requirements are contemplated, such high symmetry and well-controlled overdrive characteristics (to support digital control loop processing in the exemplary embodiment) and low overall power dissipation. The AGC circuit 100 described herein achieved all these requirements.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. An automatic gain control (AGC) circuit, comprising:
   a high gain amplifier having an input and an output, the output asserting an output signal of the AGC circuit;
   a feedback network having a first end receiving an input signal of the AGC circuit, a second end coupled to the output of the high gain amplifier and first and second intermediate nodes; and first and second transconductance amplifiers, each having an input coupled to a respective one of the first and second intermediate nodes of the feedback network and an output coupled to the input of the high gain amplifier, the first and second transconductance amplifiers collectively controlling a position of a virtual ground within the feedback network to control gain of the AGC circuit, each of the first and second transconductance amplifiers comprising:

an attenuator coupled to the feedback network; and a transconductance stage coupled to the attenuator and to the input of the high gain amplifier, each transconductance amplifier operating linearly across a relatively wide input voltage range.

2. The AGC circuit of claim 1, further comprising:

the high gain amplifier comprising a differential amplifier having a differential input and a differential output with first and second polarity outputs;

the feedback network including first and second intermediate differential nodes; and each of the first and second transconductance amplifiers having a differential input coupled to a respective one of the first and second intermediate differential nodes of the feedback network and a differential output coupled to the differential input of the differential amplifier.

3. The AGC circuit of claim 2, wherein the feedback network comprises:

a first set of resistors coupled in series between a first polarity of the input signal and the first polarity output of the differential amplifier and forming a first pair of intermediate nodes; and a second set of resistors coupled in series between a second polarity of the input signal and the second polarity output of the differential amplifier and forming a second pair of intermediate nodes.

4. The AGC circuit of claim 2, wherein each transconductance amplifier comprises:

an attenuator coupled to a corresponding intermediate differential node of the feedback network; and a transconductance stage having an input coupled to the attenuator and a differential output coupled to the differential input of the differential amplifier.

5. The AGC circuit of claim 4, wherein the attenuator comprises:

first and second differential to single ended transconductance stages; and a resistive device coupled between the first and second differential to single ended transconductance stages.

6. The AGC circuit of claim 5, wherein each of the first and second differential to single ended transconductance stages comprises:

a current mirror;

a differential pair of transistors coupled to the current mirror; and a bias current device coupled to the differential pair of transistors.

7. The AGC circuit of claim 6, wherein the bias current device of each of the first and second differential to single ended transconductance stages sinks a current that is proportional to absolute temperature.

8. The AGC circuit of claim 4, wherein the attenuator outputs first and second intermediate differential signals, wherein a first polarity of the first intermediate differential signal is a first polarity of a corresponding intermediate node pair and wherein a first polarity of the second intermediate differential signal is a second polarity of the corresponding intermediate node pair.

9. The AGC circuit of claim 8, wherein the transconductance stage comprises:

a first pair of differential transistors receiving the first intermediate differential signal and providing a first polarity of a differential output signal of a corresponding transconductance amplifier;

a second pair of differential transistors receiving the second intermediate differential signal and providing a second polarity of the differential output signal of the corresponding transconductance amplifier; and at least one bias current device that biases the first and second pairs of differential transistors.

10. The AGC circuit of claim 9, further comprising:

a first bias current device coupled to bias the transconductance stage of the first transconductance amplifier; and a second bias current device coupled to bias the transconductance stage of the second transconductance amplifier.

11. The AGC circuit of claim 10, wherein the first and second bias current devices comprise controllable current sources that are controlled to modify gain of the AGC circuit.

12. The AGC circuit of claim 11, wherein a current sum of the first and second controllable current sources remains constant across a gain range.

13. The AGC circuit of claim 12, wherein the first and second controllable current sources are controlled by a single differential current signal.

14. The AGC circuit of claim 12, wherein the first and second controllable current sources are electronically controllable.

15. The AGC circuit of claim 1, wherein an input offset voltage varies monotonically with gain of the AGC circuit.

16. An automatic gain control (AGC) circuit, comprising:

a high gain amplifier having a differential input and a differential output;

a first series of resistors coupled between a first polarity input signal and a first polarity of the differential output of the high gain amplifier, the first series of resistors forming first and second intermediate nodes;

a second series of resistors coupled between a second polarity input signal and a second polarity of the differential output of the high gain amplifier, the second series of resistors forming third and fourth intermediate nodes;

the first and third intermediate nodes forming a first intermediate differential node pair and the second and fourth intermediate nodes forming a second intermediate differential node pair;

a first transconductance amplifier having a differential input coupled to the first intermediate differential node pair, a differential output coupled to the differential input of the high gain amplifier and a first bias current control device that controls transconductance of the first transconductance amplifier; and a second transconductance amplifier having a differential input coupled to the second intermediate differential node pair, a differential output coupled to the differential input of the high gain amplifier and a second bias current control device that controls transconductance of the second transconductance amplifier;

wherein the first and second transconductance amplifiers are each configured to be linear across a relatively wide input voltage range.

17. The AGC circuit of claim 16, wherein the first and second bias current control devices are controlled to position a virtual ground between the first and second intermediate differential node pairs.

18. The AGC circuit of claim 17, wherein the first and second bias current control devices are variable between a predetermined maximum current level and a predetermined minimum current level to control gain.

19. The AGC circuit of claim 18, wherein a current sum of the first and second bias current control devices remains constant across a predetermined gain range.

20. The AGC circuit of claim 16, further comprising:
the first series of resistors including a first resistor coupled between a positive polarity input signal and the first intermediate node, a second resistor coupled between the first and second intermediate nodes, and a third resistor coupled between the second intermediate node and a non-inverting output of the high gain amplifier; and
the second series of resistors including a fourth resistor coupled between a negative polarity input signal and the third intermediate node, a fifth resistor coupled between the third and fourth intermediate nodes, and a sixth resistor coupled between the fourth intermediate node and an inverting output of the high gain amplifier.

21. The AGC circuit of claim 20, further comprising:
the first transconductance amplifier having a non-inverting input coupled to the first intermediate node, an inverting input coupled to the third intermediate node, a non-inverting output coupled to a non-inverting output of the high gain amplifier and an inverting output coupled to an inverting output of the high gain amplifier; and
the second transconductance amplifier having a non-inverting input coupled to the second intermediate node, an inverting input coupled to the fourth intermediate node, a non-inverting output coupled to the non-inverting output of the high gain amplifier and an inverting output coupled to the inverting output of the high gain amplifier.

22. The AGC circuit of claim 21, wherein the first and second transconductance amplifiers each comprise:
an attenuator having a differential input including a non-inverting input and an inverting input and first and second differential outputs, wherein the non-inverting input of the attenuator is the first polarity of the first differential output and wherein the inverting input of the attenuator is the first polarity of the second differential output; and
a transconductance stage having a first differential input coupled to the first differential output of the attenuator, a second differential input coupled to the second differential output of the attenuator, at least one bias input coupled to a corresponding bias current control device and a differential current output including a positive current terminal and a negative current terminal.

23. The AGC circuit of claim 22, wherein the transconductance stage comprises:
a first differential transistor pair having a differential input coupled to the first differential output of the attenuator, a bias terminal and a differential current output including a positive current terminal and a negative current terminal;
a second differential transistor pair having a differential input coupled to the second differential output of the attenuator, a bias terminal and a differential current output including a positive current terminal coupled to the positive current terminal of the first differential transistor pair and a negative current terminal coupled to the negative current terminal of the first differential transistor pair; and
a first bias current control device coupled to the bias terminal of the first differential transistor pair and a second bias current control device coupled to the bias terminal of the second differential transistor pair.

24. The AGC circuit of claim 22, wherein the transconductance stage comprises:
a first NPN bipolar junction transistor having a base coupled to a first polarity of the first differential output of the attenuator, an emitter and a collector forming a positive output current terminal of the transconductance stage;
a second NPN bipolar junction transistor having a base coupled to a second polarity of the first differential output of the attenuator, an emitter coupled to the emitter of the first NPN bipolar junction transistor and a collector forming a negative output current terminal of the transconductance stage;
a third NPN bipolar junction transistor having a base coupled to a first polarity of the second differential output of the attenuator, an emitter and a collector coupled to the positive output current terminal of the transconductance stage;
a fourth NPN bipolar junction transistor having a base coupled to a second polarity of the second differential output of the attenuator, an emitter coupled to the emitter of the third NPN bipolar junction transistor and a collector coupled to the negative output current terminal of the transconductance stage;
a first bias current control device coupled to the emitters of the first and second NPN bipolar junction transistors; and
a second bias current control device coupled to the emitters of the third and fourth NPN bipolar junction transistors.

25. The AGC circuit of claim 22, further comprising:
a first bias control current device coupled to bias the transconductance stage of the first transconductance amplifier; and
a second bias control current device coupled to bias the transconductance stage of the second transconductance amplifier.

26. The AGC circuit of claim 25, wherein a current sum of the first and second bias control current devices remains constant across a gain range.

27. The AGC circuit of claim 25, wherein each attenuator comprises:
a first differential to single ended transconductance stage having a first output terminal;
a second differential to single ended transconductance stage having a second output terminal; and
a resistive device coupled between the first and second output terminals.

28. The AGC circuit of claim 27, wherein the first and second differential to single ended transconductance stages each comprise:
a current mirror;
a differential pair of transistors coupled to the current mirror; and
a current sink coupled to bias the differential pair of transistors.

29. The AGC circuit of claim 28, further comprising:

the current mirror comprising:
- a first PNP bipolar transistor having an emitter coupled to a supply signal and a base and collector coupled together; and
- a second PNP bipolar transistor having an emitter coupled to the supply signal, a base coupled to the base of the first PNP bipolar transistor and a collector; and the differential pair of transistors comprising:
- a first NPN bipolar transistor having a collector coupled to the collector of the first PNP bipolar transistor, an emitter coupled to the current sink and a base receiving one polarity of a differential input signal; and
- a second NPN bipolar transistor having a collector coupled to the collector of the second PNP bipolar transistor, an emitter coupled to the current sink and a base coupled to its collector and to one end of the resistive device.

30. The AGC circuit of claim 29, wherein the current sink sinks a current that is proportional to absolute temperature.

* * * * *